(12) United States Patent
Wüest

(10) Patent No.: US 6,683,311 B1
(45) Date of Patent: Jan. 27, 2004

(54) DEPLOYABLE PARTICLE COLLECTOR FOR SPACE PARTICLE INSTRUMENTS

(75) Inventor: Martin Peter Wüest, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 22 days.

(21) Appl. No.: 09/998,086

(22) Filed: Nov. 30, 2001

(51) Int. Cl.$^7$ ............................................... H01J 37/244
(52) U.S. Cl. ....................................... 250/397; 250/287
(58) Field of Search ................................... 250/287, 397

(56) References Cited

U.S. PATENT DOCUMENTS

| | | | | |
|---|---|---|---|---|
| 4,823,003 A | * | 4/1989 | King ............................ | 250/305 |
| 5,101,113 A | | 3/1992 | Hirleman, Jr. et al. ....... | 250/574 |
| 5,200,758 A | * | 4/1993 | Gillard ........................ | 343/880 |
| 5,742,061 A | * | 4/1998 | Lemonnier et al. ........ | 250/385.1 |
| 5,825,487 A | | 10/1998 | Felbinger et al. ........... | 356/338 |
| 5,946,091 A | | 8/1999 | Yufa ............................ | 356/336 |
| 5,962,850 A | * | 10/1999 | Wüest ......................... | 250/287 |
| 6,016,194 A | | 1/2000 | Girvin et al. ............... | 356/337 |
| 6,034,769 A | | 3/2000 | Yufa ............................ | 356/335 |
| 6,094,166 A | * | 7/2000 | Martek et al. .............. | 342/374 |
| 6,343,442 B1 | * | 2/2002 | Marks .......................... | 52/71 |
| 6,421,005 B1 | * | 7/2002 | Weaver et al. .............. | 342/367 |

OTHER PUBLICATIONS

McInnes, Colin Robert, Reader in Space Systems Engineering Solar Sailing, Technology, Dynamics and Mission Applications ; Department of Aerospace Engineering, University of Glasgow, Glasgow, Scotland, Praxis Publishing, Chichester, UK, pp. 8–9, 13, 60–76, 99–111, 237, 1999.

* cited by examiner

*Primary Examiner*—John R. Lee
*Assistant Examiner*—Phillip A Johnston
(74) *Attorney, Agent, or Firm*—Baker Botts L.L.P.

(57) ABSTRACT

A collapsible particle collector for collecting particles and directing them to an aperture of a particle detector. One embodiment of the invention uses an electrostatic mirror, having a reflective grid and at least one reference grid, which may be collapsed or opened, in an umbrella type manner, using a radial rib type mechanism.

13 Claims, 4 Drawing Sheets

US 6,683,311 B1

DEPLOYABLE PARTICLE COLLECTOR FOR SPACE PARTICLE INSTRUMENTS

TECHNICAL FIELD OF THE INVENTION

This invention relates to instrumentation for collecting particles in space, and more particularly to a particle collecting device for such instrumentation.

BACKGROUND OF THE INVENTION

Particle analyzers are a type of instrumentation, used to measure the particle flux and other parameters of particles in free space. A common use of particle analyzers is in the field of space physics, where particles in space are collected and analyzed.

For collecting particles for space physics applications, there is a need for having a large collection area so as to collect as many particles as possible. The medium is tenuous and a large collection area increases sensitivity of the instrumentation and permits shorter integration times. For example, the density of the solar wind decays with the radial distance, r, from the sun by the inverse square, $1/r^2$. For an instrument in the outer solar system to have the same sensitivity as one at one astronomical unit (the mean distance from the Earth to the Sun), its collection area must be increased by a similar factor. Also, the solar wind consists largely of ionized hydrogen mixed with about four percent helium and some minor constituents. Presently, long integration times are needed to obtain good counting statistics for minor ions. A large collection area increases the number of observed particles for a given particle flux.

There is also a need for space particle analysis instrumentation to be as small and lightweight as possible. This reduces constraints on the load capacities of the rockets that carry the instrumentation into space.

SUMMARY OF THE INVENTION

One aspect of the invention is an electrostatic mirror type deployable particle collector. An electrostatic mirror has a reflection grid and at least one reference grid, the grids being typically curved and concentric. An electrically conductive particle reflection grid is held at an electrical potential for reflecting electrically charged particles. At least one electrically conductive reference grid has a radius slightly smaller than that of the reflection grid, and is held at a ground reference electric potential. The reflection grid and the reference grid have a common focus point for reflecting electrically charged particles. A deployment mechanism is used to reconfigure the mirrors from a stowed state to a deployed state. For example, the deployment mechanism may be a radial rib type mechanism that deploys the mirror in an umbrella like manner.

An advantage of the invention is that it increases the particle collection area, while maintaining a small launch volume. Through the use of a deployable collector, on-board instrumentation can achieve greater sensitivity without increasing launch volume.

Various embodiments of the invention provide unfoldable, unfurlable, or inflatable collectors in front of a conventional particle analyzer. By analogy to optics, the front-end collector acts like a magnifying glass to a camera. A reflective (electrostatic mirror) design of the collector is analogous to an optical mirror telescope, whereas a transmissive (parallel plate) design is analogous to a Fresnel lens.

DETAILED DESCRIPTION OF THE INVENTION

Deployable Electrostatic Mirror

It is known that one approach to providing a large aperture particle collector is to use one or more electrostatic mirrors. This approach is described in U.S. Pat. No. 5,962,850, entitled "Large Aperture Particle Detector with Integrated Antenna", to M. Wuest, assigned to Southwest Research Institute. Although that patent does not discuss deployable collectors, it is incorporated herein by reference, especially for purposes of describing the structure and operation of electrostatic mirror particle collectors in general.

In its simplest embodiments, an electrostatic mirror for charged particles has an electrically biased surface behind a grounded grid. The front grid is held at ground potential so that the charged particles do not change trajectory by being attracted or repelled before they enter the potential between the front grid and the biased surface. For positively charged ions, the bias is at positive potential. Positive ions, which enter the potential between the grid and the surface, are slowed down and eventually change or reverse direction.

Figure 1A:
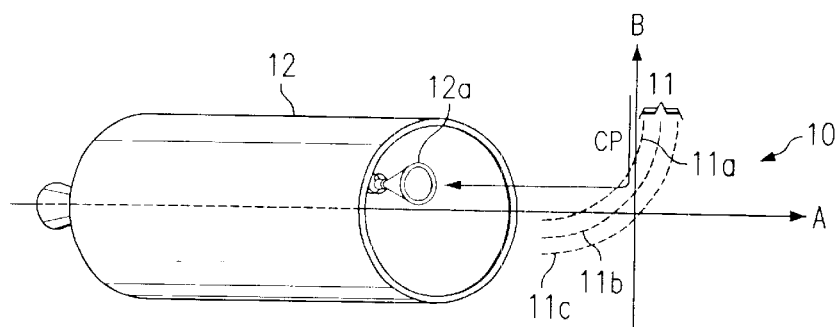
FIG. 1A is a schematic illustration of a first embodiment of a mirror type deployable particle collector.

FIG. 1A is a schematic illustration of a first embodiment of a deployable particle collector 10. Collector 11 is shown in cross section, mounted on a spacecraft 12 such as a satellite, in the deployed position.

In FIG. 1, the spacecraft 12 spins around the axis A—A. The direction of the magnetic field is indicated by B, and is approximately perpendicular to the spacecraft spin axis. Charged particles, CP, are directed to mirror 11. The spacecraft 12 is equipped with a particle detector system 12a.

Mirror 11 typically has a three-dimensional parabolic configuration similar to dish type antennas. However, mirror 11 could also be flat, spherical, cylindrical, or hyperbolic. The focus point could be either on-axis or off-axis.

In the embodiment of FIG. 1A, mirror 11 comprises three concentric mesh grids, 11a, 11b, and 11c. The outer (reference) grids, 11a and 11c, are maintained at ground potential, and may be described as "electrically conductive reference grids". The middle (reflection) grid, 11b, is biased at a high voltage, and may be described as an "electrically conductive primary reflection grid". The grounding of grids 11a and 11c prevents electrical potential from the middle grid, 11b, from affecting the trajectories of particles prior to their entry into mirror 11. Thus, both charged surfaces of grid 11b are prevented from exposure to the space plasma.

The voltage of the middle (reflection) grid, 11b, may be variable and set such that only particles of a certain energy per charge range are reflected. In the solar wind, where essentially all solar wind ions travel at nearly the same speed, this provides a mass filter.

In alternative embodiments, in other embodiments, only one grounding (reference) grid, 11a or 11c, may be used, rather than both grounding grids. If only a front grounding grid 11a is used, the reflective grid 11b may be a surface rather than a mesh. Also, more than one grid may be placed in front of or behind the reflective grid 11b.

In operation, charged particles within the collection range of mirror 11 are focused to a small aperture of detector 12a. High energy particles pass through the mirror 11. Also, most electromagnetic radiation passes through mirror 11 and very little is reflected to the detector 12a.

Figure 1B:
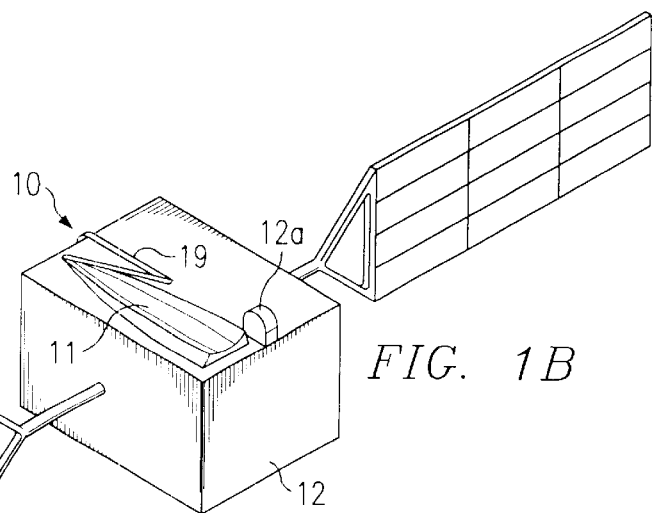
FIGS. 1B and 1C are perspective views of an example of an implementation of the collector of FIG. 1A, in the stowed and deployed positions, respectively.
Figure 1C:
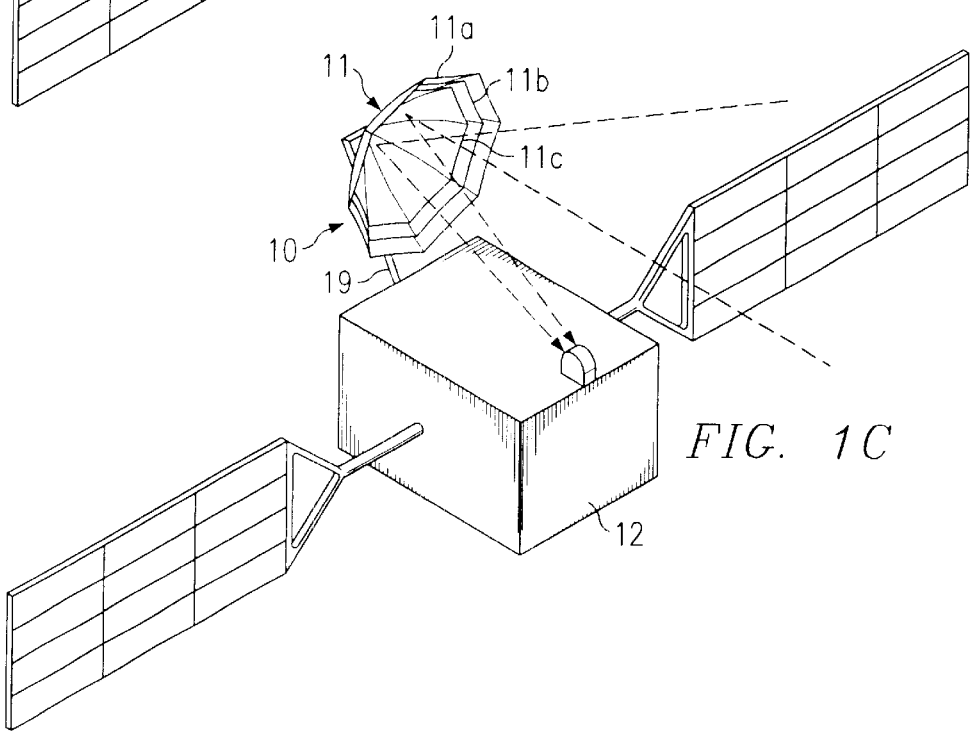

FIGS. 1B and 1C are perspective views of an example of an implementation of collector 10, in the stowed and deployed positions, respectively. For deployment, the deployment mechanism may be motorized and operated with appropriate electronic controls.

The deployment mechanism of FIGS. 1B and 1C has essentially a "radial rib" deployment design. In FIG. 1B, mirror 11 is folded like an umbrella along the side of the spacecraft 12 during launch. Mirror 11 may be comprised of articulated rigid segments or of a flexible material so as to permit the folding and unfolding. An arm 19 is mechanically operable to extend and turn in whatever direction(s) are required to appropriately position the mirror 11. A radial rib mechanism is used to open the mirror 11. A plasma analyzer 12a is mounted on the spacecraft 12.

In FIG. 1C, the previously folded collector 10 is unfolded once the spacecraft 12 reaches its orbit. Visible are the three meshes of mirror 11 that form the electrostatic mirror. The outer two meshes 11a and 11c are grounded. The inner mesh 11b is set at a potential that varies according to a selected energy per charge ratio and the charge of the particles, that is, whether they are electrons or positively charged particles such as protons or $He^{++}$. Also shown are two trajectories of particles coming from different directions, focussed onto the entrance aperture of the analyzer 12a.

The above-described deployment mechanism is but one example of a deployment mechanism for mirror 11, and numerous alternative mechanisms are possible. For example, various deployment mechanisms have been described in connection with telecommunications antenna on spacecraft. Those techniques are applicable to the present invention.

Figure 2A:
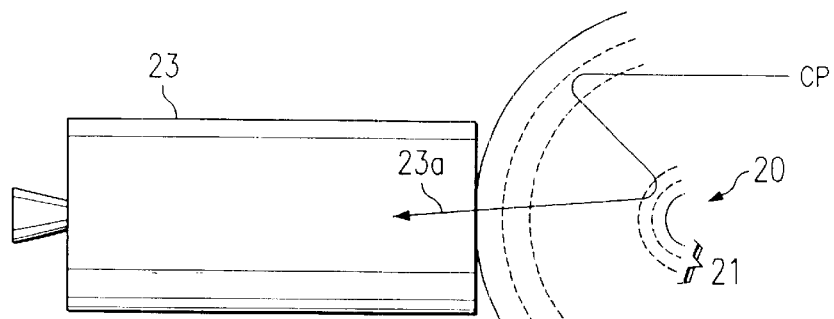
FIG. 2A is a schematic illustration of a second embodiment of a mirror type deployable particle collector.

FIG. 2A is a schematic view of a second embodiment of the invention, where collector 20 is implemented with a Cassegrain mirror design, mounted on a spacecraft 23. A first mirror 21 is smaller than a second mirror 22. As is the case with mirror 11, mirrors 21 and 22 could be various shapes. They need not both be the same shape. When deployed, mirror 21 is centered relative to, and spaced apart from, mirror 22. The convex surface of mirror 21 faces the concave surface of mirror 22. From the point of view of the particle, mirror 22 is the primary mirror and is concave whereas mirror 21 is the secondary mirror and is convex. In other embodiments, mirror 21 could be concave.

In operation, charged particles are reflected from the concave surface of the larger mirror 22 and are directed toward the convex surface of mirror 21. Mirror 21 focuses the particles toward an aperture 23a of particle analysis instrumentation (not shown) carried by spacecraft 23.

Figure 2B:
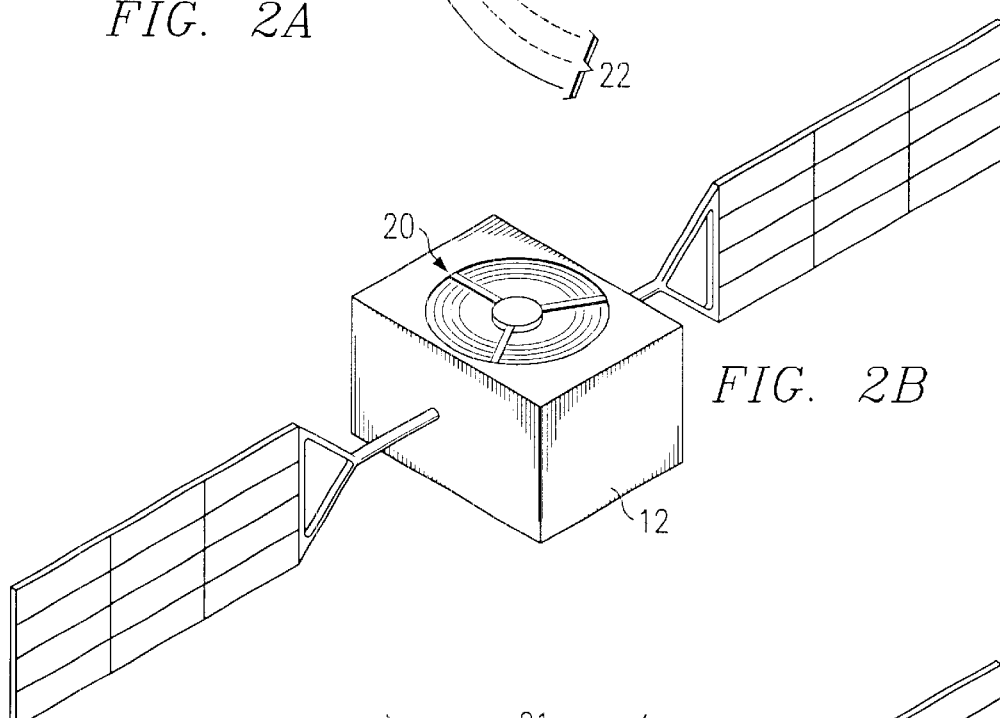
FIGS. 2B and 2C are perspective views of an example of an implementation of the collector of FIG. 2A, in the stowed and deployed positions, respectively.
Figure 2C:
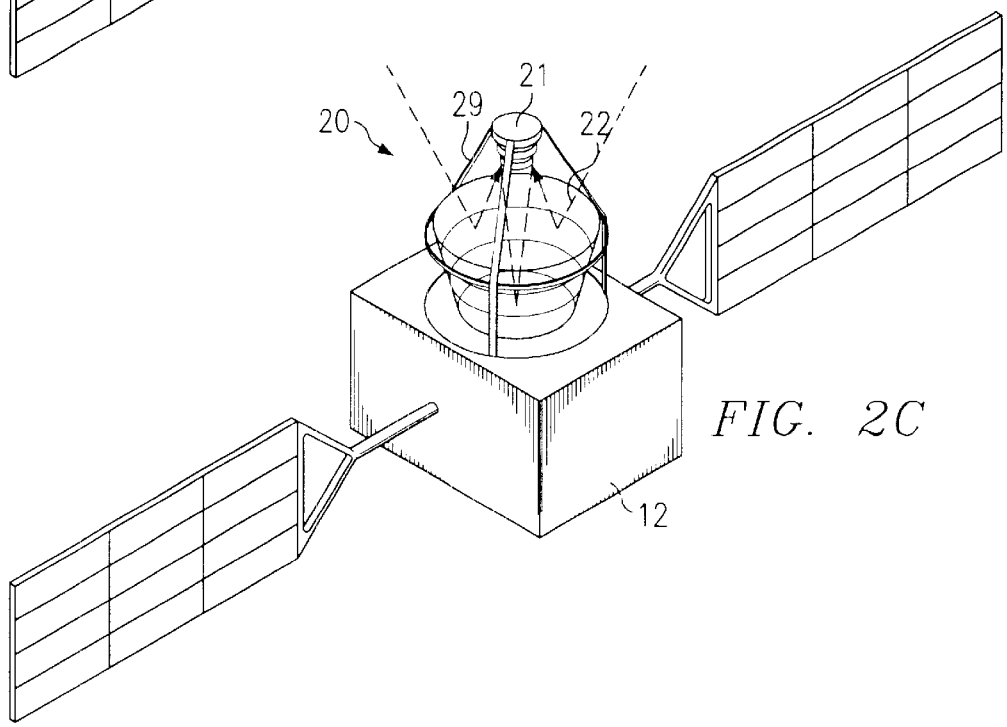

FIGS. 2B and 2C are perspective views of an example of an implementation of collector 20, in the stowed and deployed positions, respectively. In FIG. 2B, the mirrors 21 and 22 are retracted in the spacecraft structure. In FIG. 2C, mirrors 21 and 22 are deployed in a manner similar to the unfolding of collapsible "camp cups". Several sectors are extended. The inner portion of the ring-like stowed collector 20 is layered with a three layer mesh (mirror 21), to be deployed and held in place with springs and standoffs to provide a parabolic shape. The tripod-like deployment structure 29 is erected using telescoping extension segments similar to photographic tripods. The outer portion of collector 20 is also layered with a three-layer mesh (mirror 22). Also shown are two particle trajectories as they are reflected on the primary mirror 22 to the secondary mirror 21 and then into the particle analyzer, which is not shown but is located beneath the mesh in the body of spacecraft 23.

Deployable Parallel Plates

Figure 3:
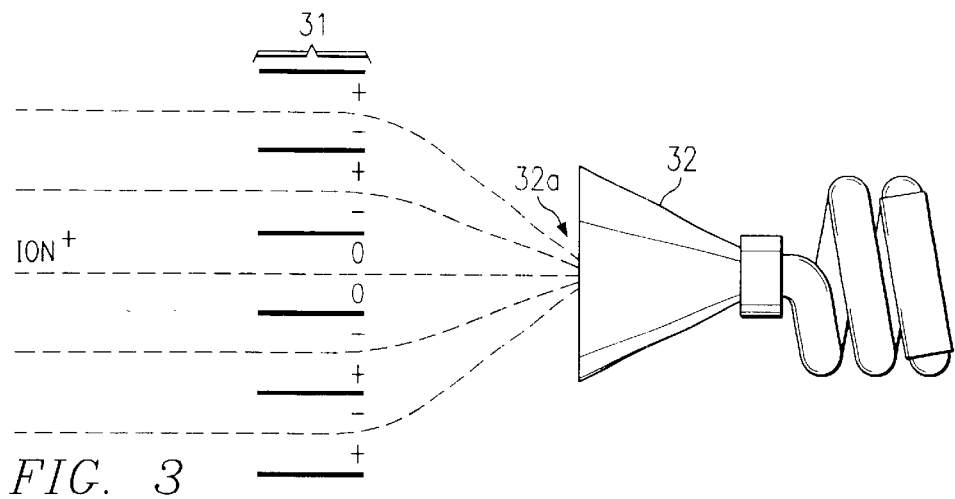
FIG. 3 is a schematic illustration of a parallel plate type deployable particle collector.

FIG. 3 illustrates how a stack of parallel plates 31 may be used to implement a particle collector. The plus and minus signs show the polarity of voltages applied to the plates 31 in order to deflect ions. The particles are focused to an aperture 32a of detector 32.

Each pair of parallel plates 31 provides an electrical potential across the gap between the two plates 31. Charged particles entering the electric field between the plates 31 are deflected towards the plate 31 of opposite charge to the charge of the particle. The particle may be thus focussed to a point to one side of the plates 31, such as to aperture 32a.

Figure 4:
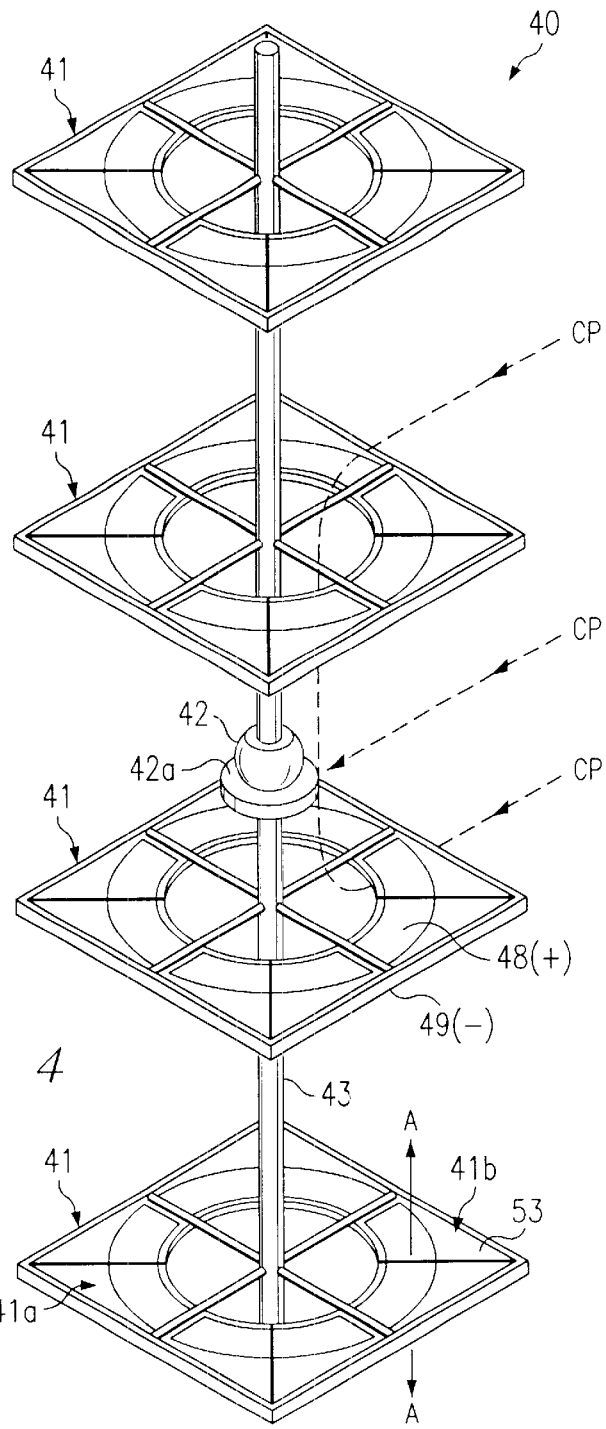
FIG. 4 is a perspective view of an example of an implementation of the collector of FIG. 3, in the deployed position.

FIG. 4 illustrates a fully deployed particle collector 40 having a parallel plate design. A stack of plates 41 is deployed in a position in front of the entrance aperture 42a of a particle detector 42. Each plate 41 has a top conducting ring 48, to which an appropriate voltage is applied as explained above in connection with FIG. 3.

Figure 4A:
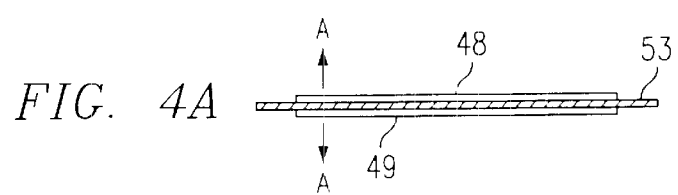
FIG. 4A is a cross-sectional view of a single plate of the collector of FIG. 4.

As illustrated in FIG. 4A, which is a cross-sectional view of a single plate 41, each plate 41 also has a bottom conducting ring 49, electrically isolated from the top conducting ring 48, to which an appropriate voltage is also applied. As explained below in connection with FIG. 5, in implementation, rings 48 and 49 may be surface coatings on an inner non conductive layer 53.

In operation, charged particles, CP, are bent toward the aperture by applying the appropriate voltage across the vacuum gap of the parallel plates 41. The value of the voltage is different across each gap to allow for proper focusing of the charged particles on the entrance aperture of the instrument. Three particle trajectories are illustrated.

As illustrated in FIG. 4, where plates 41 are ring-shaped and stacked along a vertical boom 43, the particles may be redirected to a common aperture. The detector 42 is a "top hat" type detector. An advantage of collector 40 is that particles may enter from all directions. In other embodiments, the particles could be redirected to a point outside the plates, as shown in FIG. 3.

Collector 40 is deployed on a telescoping boom 43. In the embodiment of FIG. 4, in the non deployed position, boom 43 is collapsed, such that the gaps between plates 41 are reduced or eliminated. The spacecraft upon which detector 42 and collector 40 are mounted is assumed to have appropriate deployment control mechanisms, such that an electrical signal or other actuating event may cause boom 43 to extend, thereby separating plates 41 to form the configuration illustrated in FIG. 4.

Figure 5:
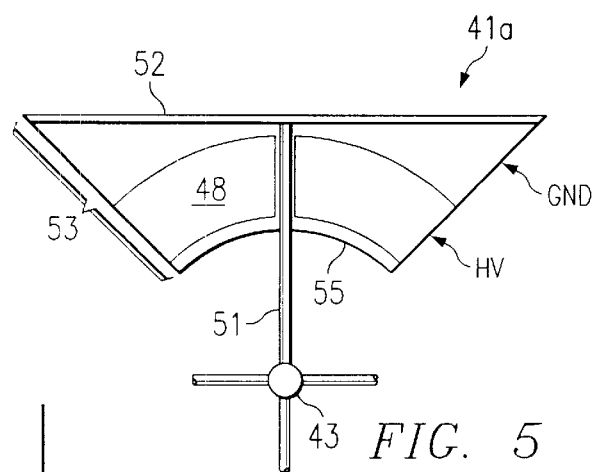
FIG. 5 illustrates a quarter segment of a plate of the collector of FIG. 4.

FIG. 5 illustrates a quarter segment 41a of a plate 41. Referring to both FIGS. 4 and 5, four segments 41a are arranged around boom 43 to form one plate 41.

Each segment 41a is supported on smaller cross members 51 and 52, which are deployed in the plane of plates 41. During deployment, these cross members booms 51 and 52 are extended in orthogonal directions relative to each other and perpendicular to the boom 43. In a deployed position, cross member 51 or 52, or both, may be telescoped and or folded by means of a hinge.

In addition to cross members 51 and 52, segment 41a comprises a thin insulating piece of foldable segment cloth 53. An example of a suitable material for segment cloth 53 is polyamide, polyimide, Mylar, or foil. A specific commercially available material is Kapton, manufactured by the Dupont Corporation. Cloth 53 is coated on both sides with a conducting material, in a semicircular pattern, to form conducting rings 48 and 49 for each plate 41. Only a top ring 48 is explicitly shown. The insulating property of cloth 53 serves to electrically isolate top ring 48 and 49 from each other. An example of a suitable conducting material is a metal film. As indicated in FIG. 5, cloth 53 is held at ground, GND, everywhere except where coated with conductive material. The upper and lower rings 48 and 49 are held at high voltage, HV.

As an alternative to being foldable, segments 41a may be made from rigid material. In this embodiment, rather than being unfurled, segments 41a could be placed atop each other in the undeployed position, and rotated to form plates 41 in the deployed position. In this embodiment, plates 41 could be easily made round rather than rectangular in shape.

In the undeployed position of collector 40, boom 52 is folded against boom 51, boom 51 is unextended and material 53 is folded, sail-like between these cross members.

During deployment, the extension or unhinging of cross member 51 unfolds material 53. A small wire 55 may be used to help stiffen the deployed cloth 53. Spring like mechanisms may be used to unfurl cloth 53.

Figure 6:
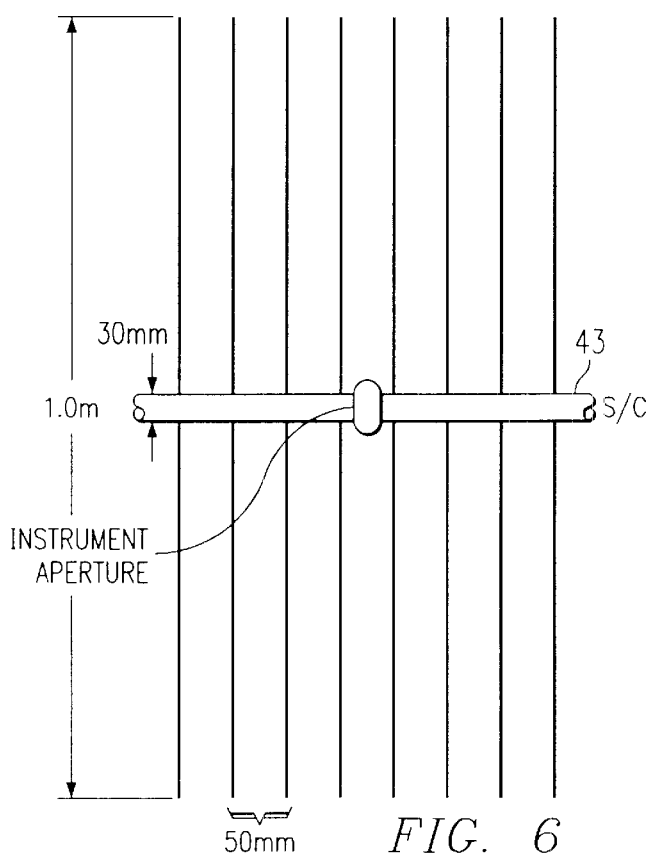
FIG. 6 is a side view of the collector of FIG. 4.
Figure 7:
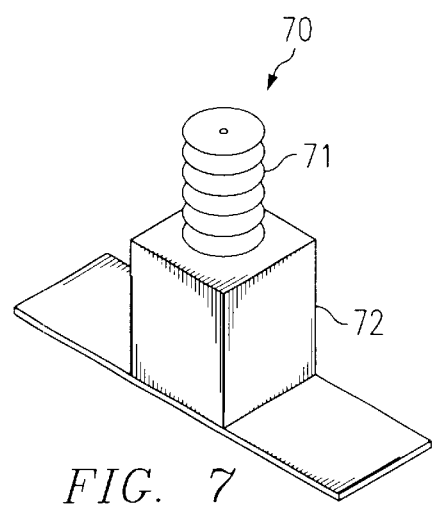
FIG. 7 another example of a parallel plate type collector, having circular plates and in the deployed position.

FIG. 6 is a side view of the collector 40 of FIG. 4. It further shows exemplary dimensions for an implementation suitable for spacecraft payload. Telescoping boom 43 has a diameter of 30 millimeters. Plates 41 are square, 1 meter on each side. Plates 41 are spaced 50 millimeters apart. FIG. 7 illustrates another example of a parallel plate type collector 70. Collector 70 has plates 71 that are circular rather than rectangular, and is shown in a deployed position, on a spacecraft 72.

Other Embodiments

Although the present invention has been described in detail, it should be understood that various changes, substitutions, and alterations can be made hereto without departing from the spirit and scope of the invention as defined by the appended claims.

What is claimed is:

1. A Cassegrain electrostatic mirror type deployable particle collector, comprising:

a first electrostatic mirror, having a shaped electrically conductive primary particle reflection grid, held at an electrical potential for reflecting electrically charged particles, and a shaped electrically conductive primary reference grid having a radius smaller than that of the primary reflection grid, held at a ground reference electric potential, wherein the primary reflection grid and the primary reference grid have a common particle focus point for reflected electrically charged particles;

a second electrostatic mirror, having a shaped electrically conductive secondary particle reflection grid, held at an electrical potential for reflecting electrically charged particles, and a shaped electrically conductive secondary reference grid having a radius smaller than that of the primary reflection grid, held at a ground reference electric potential, wherein the secondary reflection grid and the secondary reference grid have a common secondary particle focus point for reflecting electrically charged particles;

wherein the first mirror and the second mirror are arranged in a Cassegrain configuration and wherein at least one of the mirrors has annular sections; and a deployment mechanism for reconfiguring the mirrors from a stowed state to a deployed state, the deployment mechanism operable to collapse or extend the annular sections.

2. The collector of claim 1, wherein at least one of the mirrors is cup-shaped and the deployment mechanism is a operable to provide a collapsing means for the cup shape.

3. The collector of claim 1, wherein the deployment mechanism has a telescoping tripod for opening at least one of the mirrors.

4. The collector of claim 1, wherein the shape of the grids is selected from a group consisting of parabolic, flat, spherical, cylindrical, and hyperbolic.

5. A parallel plate type deployable particle collector, comprising:

at least three flat electrically conductive plates, spaced from each other by an air gap, and being held at varying electrical potentials to focus electrically charged particles to a common focal point; and a telescoping boom along whose axis the plates are stacked, the telescoping boom operable to extend and retract such that the plates may be collapsed toward each other in a stowed state and away from each other in a deployed state.

6. The collector of claim 5, wherein each plate comprises a first conductive surface and a second conductive surface, and wherein the surfaces are electrically isolated by an inner layer of non conductive material.

7. The collector of claim 3, wherein the plates are rectangular in shape.

8. The collector of claim 5, wherein the plates are made from flexible material segments.

9. The collector of claim 5, wherein the plates are made from segments that deploy to form a square frame that supports circular rings, wherein each ring is comprised of a middle layer of non conductive material sandwiched between outer layers of conductive material.

10. The collector of claim 5, wherein the focal point is between two of the plates.

11. The collector of claim 5, wherein the plates are ring-shaped and direct incoming particles to a focus toward the boom.

12. The collector of claim 5 wherein at least some of the plates are made from two or more foldable segments.

13. The collector of claim 5, wherein at least some of the plates are made from two or more rigid segments, the segments operable to rotate atop each other.

* * * * *

UNITED STATES PATENT AND TRADEMARK OFFICE
CERTIFICATE OF CORRECTION

PATENT NO. : 6,683,311 B1
DATED : January 27, 2004
INVENTOR(S) : Martin Peter Wüest It is certified that error appears in the above-identified patent and that said Letters Patent is hereby corrected as shown below:

<u>Column 6,</u>
Line 46, please delete "The collector of claim 3," and replace with -- The collector of claim 5, --.

Signed and Sealed this

Third Day of August, 2004

JON W. DUDAS
*Acting Director of the United States Patent and Trademark Office*